US012696820B2

(12) United States Patent
Sutardja

(10) Patent No.: US 12,696,820 B2
(45) Date of Patent: Jul. 28, 2026

(54) METHOD OF MANUFACTURING FAN-OUT PACKAGING DEVICE AND FAN-OUT PACKAGING DEVICE MANUFACTURED THEREBY

(71) Applicant: SILICON BOX PTE. LTD., Singapore (SG)

(72) Inventor: Sehat Sutardja, Las Vegas, NV (US)

(73) Assignee: SILICON BOX PTE. LTD., Singapore (SG)

( * ) Notice: Subject to any disclaimer, the term of this patent is extended or adjusted under 35 U.S.C. 154(b) by 352 days.

(21) Appl. No.: 18/630,516

(22) Filed: Apr. 9, 2024

(65) Prior Publication Data

US 2024/0347433 A1 Oct. 17, 2024

(30) Foreign Application Priority Data

Apr. 13, 2023 (KR) ........................ 10-2023-0048548
Apr. 8, 2024 (KR) ........................ 10-2024-0047088

(51) Int. Cl.
  *H10W 90/00* (2026.01)
  *H10W 72/00* (2026.01)
  *H10W 72/20* (2026.01)

(52) U.S. Cl.
  CPC ....... *H10W 90/701* (2026.01); *H10W 72/071* (2026.01); *H10W 72/072* (2026.01); *H10W 72/247* (2026.01)

(58) Field of Classification Search
  CPC ............. H10W 72/072; H10W 72/071; H10W 72/247; H10W 70/614; H10W 70/05; H10W 90/701
  See application file for complete search history.

(56) References Cited

U.S. PATENT DOCUMENTS

| | | | | |
|---|---|---|---|---|
| 2013/0062760 A1* | 3/2013 | Hung | .................. | H10W 74/014 |
| | | | | 257/738 |
| 2018/0174865 A1* | 6/2018 | Yu | ........................ | H10W 74/019 |
| 2020/0020627 A1* | 1/2020 | Tsai | ........................ | H10P 72/74 |
| 2020/0135567 A1* | 4/2020 | Tu | .......................... | H10D 84/01 |
| 2022/0271018 A1* | 8/2022 | Chen | ....................... | H10P 72/74 |
| 2022/0320022 A1* | 10/2022 | Kuo | ..................... | H01Q 1/2283 |
| 2024/0178112 A1* | 5/2024 | Chen | .................. | H10W 74/117 |
| 2025/0079329 A1* | 3/2025 | Wang | ..................... | H10W 46/00 |

* cited by examiner

*Primary Examiner* — Mohsen Ahmadi
(74) *Attorney, Agent, or Firm* — Dinsmore & Shohl LLP; Yongsok Choi, Esq.

(57) ABSTRACT

Disclosed is a method of manufacturing a fan-out packaging device using wafer or panel level packaging including forming a base metal layer on a partial area of a fan-out packaging substrate, forming a first dielectric layer on the base metal layer, patterning the first dielectric layer to form a via hole, forming a redistribution layer (RDL) on the first dielectric layer and the via hole, forming a second dielectric layer on the redistribution layer (RDL), and patterning the second dielectric layer to form a bump structure connected to the redistribution layer.

24 Claims, 7 Drawing Sheets

METHOD OF MANUFACTURING FAN-OUT PACKAGING DEVICE AND FAN-OUT PACKAGING DEVICE MANUFACTURED THEREBY

CROSS-REFERENCE TO RELATED APPLICATION

This application claims priority to Korean Patent Application No. 10-2023-0048548, filed on Apr. 13, 2023, and Korean Patent Application No. 10-2024-0047088, filed on Apr. 8, 2024, the entire contents of which are herein incorporated by reference.

BACKGROUND OF THE INVENTION

Field of the Invention

The present disclosure relates to a method of manufacturing a fan-out packaging device using a wafer or panel level packaging process that exhibits improved characteristics by forming a base metal layer on a fan-out packaging substrate, and a fan-out packaging device manufactured thereby.

Description of the Related Art

Eight major semiconductor processes include a wafer process, an oxidation process, a photo process, an etching process, a thin film process, a wiring process, a test process, and a packaging process.

The present invention relates to a packaging process among the semiconductor processes. Generally, the semiconductor packaging process includes wafer cutting, die attach, die interconnection, molding, and packaging test.

A conventional semiconductor packaging process involves cutting the wafer and then the packaging process. On the other hand, recently, "wafer level packaging (WLP)" of maintaining the die in the wafer state has been performed. The WLP is performed by packaging a wafer and testing, and then cutting the die (chip) and has an advantage of reducing production cost compared to the conventional method.

In addition, research is actively underway on the panel level packaging (PLP), in addition to wafer level packaging. PLP has an advantage of further reducing production costs due to the greater number of dies that can be packaged compared to the WLP.

Meanwhile, in accordance with high-integration, high performance, and miniaturization of semiconductor devices, various packaging technologies are evolving based on the wafer-level or panel-level packaging, and active research is underway on fan-in (wafer or panel) level packaging, fan-out wafer or panel level packaging and the like.

In particular, fan-out wafer or panel level packaging (referred to hereinafter as "fan-out wafer level packaging" for convenience, and also called "Fan Out WLP" or "FO-WLP" if necessary) is performed in a fan-out manner to increase the number of I/O pins. This method can expand the scope of wiring formation beyond the die area using a RDL (re-distribution layer) process, thereby securing a larger wiring forming surface compared to the die size.

In this fan-out wafer level packaging, the RDL includes forming a dielectric layer on the die surface, forming a wiring layer using copper plating, and repeating this process as necessary to expand the range of wiring formation outside the die.

Here, in order to improve the yield and contact resistance of the wiring layer using the RDL process, it is very important to improve the quality of the plating layer during the copper plating process.

In the related art, attempts have been made to slow down the plating speed or improve the plating process conditions to improve the quality of the plating layer. However, these attempts slow down the process speed and do not ensure process reproducibility.

In addition, when the RDL wiring layer includes a plurality of layers, a dielectric layer is formed between the plating processes, which cause problems such as unevenness of the dielectric layer and deterioration of the surface topology due to the deterioration in quality of the plating layer and ultimately results in defects in the wiring layer due to the subsequent RDL process. This causes an increase in contact resistance or impedance, which has the disadvantage of a low operating frequency.

SUMMARY OF THE INVENTION

Therefore, the present invention has been made in view of the above problems, and it is an object of the present invention to provide a method of manufacturing a fan-out packaging device that exhibits improved characteristics by forming a base metal layer on a fan-out packaging substrate, and a fan-out packaging device manufactured thereby.

In accordance with one aspect of the present invention, the above and other objects can be accomplished by the provision of a method of manufacturing a fan-out packaging device using wafer or panel level packaging including forming a base metal layer on a partial area of a fan-out packaging substrate, forming a first dielectric layer on the base metal layer, patterning the first dielectric layer to form a via hole, forming a redistribution layer (RDL) on the first dielectric layer and the via hole, forming a second dielectric layer on the redistribution layer (RDL), and patterning the second dielectric layer to form a bump structure connected to the redistribution layer.

In accordance with another aspect of the present disclosure, provided is a packaging device for wafer or panel level packaging including a fan-out packaging substrate, a base metal layer formed on a partial area of the fan-out packaging substrate, a first dielectric layer formed on the base metal layer and including a via hole to expose a part of the base metal layer, a redistribution layer (RDL) formed on the first dielectric layer and the via hole, a second dielectric layer formed on the redistribution layer (RDL) and patterned to expose a part of the redistribution layer, and a bump structure formed on the second dielectric layer and connected to the redistribution layer.

In addition, the base metal layer may include a signal unit formed on a signal pad area of a die, and a base unit separated from the signal unit and formed on an entirety or part of a remaining area of the fan-out packaging substrate.

In addition, the base unit may include a first base portion separated from the signal unit and formed on the fan-out packaging device, and a second base portion formed along an edge of the fan-out packaging device or an edge of the fan-out packaging substrate.

In addition, a bridge may be formed between the first base portion and the second base portion.

In addition, the signal unit may be formed in a wider area than the signal pad of the die. In addition, the signal unit may be aligned with and may contact the redistribution layer.

In addition, a ground plate of the redistribution layer and the bump structure may be connected to the base unit through the via hole of the first dielectric layer.

In addition, a hole or a roughness pattern may be formed in an entirety or part of the base metal layer. The diameters of the hole and the roughness pattern may be less than twice the thickness of the base metal layer.

In addition, the base metal layer may include a copper (Cu)-based material. The base metal layer may be formed as a copper layer on a titanium (Ti) or titanium tungsten (TiW) layer. The base metal layer may have a thickness of 1 to 2.2 μm.

In addition, the base metal layer may be formed by forming a metal layer on the fan-out substrate, forming a photoresist pattern on the fan-out substrate through a photolithography process, etching the metal layer using the photoresist pattern as an etching mask, and then removing the photoresist pattern.

In addition, the base metal layer may be formed by forming a photoresist pattern on the fan-out substrate through a photolithography process, depositing a metal layer using the photoresist pattern as a deposition mask, and removing the photoresist pattern.

In addition, the base metal layer may be formed by forming a plating layer on the fan-out substrate, forming a photoresist pattern on the plating layer through a photolithography process, depositing a metal layer using the photoresist pattern as a deposition mask, removing the photoresist pattern, and etching the plating layer.

In addition, the formation of the first dielectric layer and the formation of the redistribution layer may be repeatedly performed to form a plurality of redistribution layers/dielectric layers.

BRIEF DESCRIPTION OF THE DRAWINGS

The above and other objects, features, and other advantages of the present disclosure will be more clearly understood from the following detailed description taken in conjunction with the accompanying drawings, in which.

DETAILED DESCRIPTION OF THE INVENTION

The present invention is directed to a fan-out packaging device using a wafer or panel level packaging process, more specifically, to a fan-out packaging device that exhibits improved electrical characteristics by forming a base metal layer on a fan-out packaging substrate.

Figure 3:
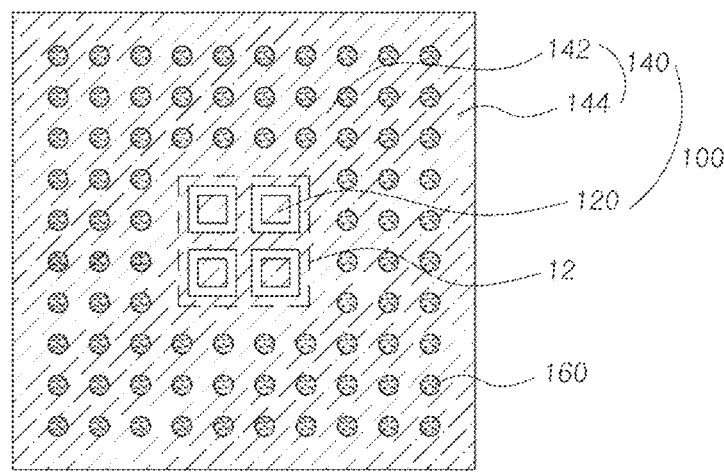
FIGS. 3 to 5 are plan schematic diagrams illustrating a fan-out packaging substrate on which a base metal layer is formed according to various embodiments of the present invention.
Figure 4:
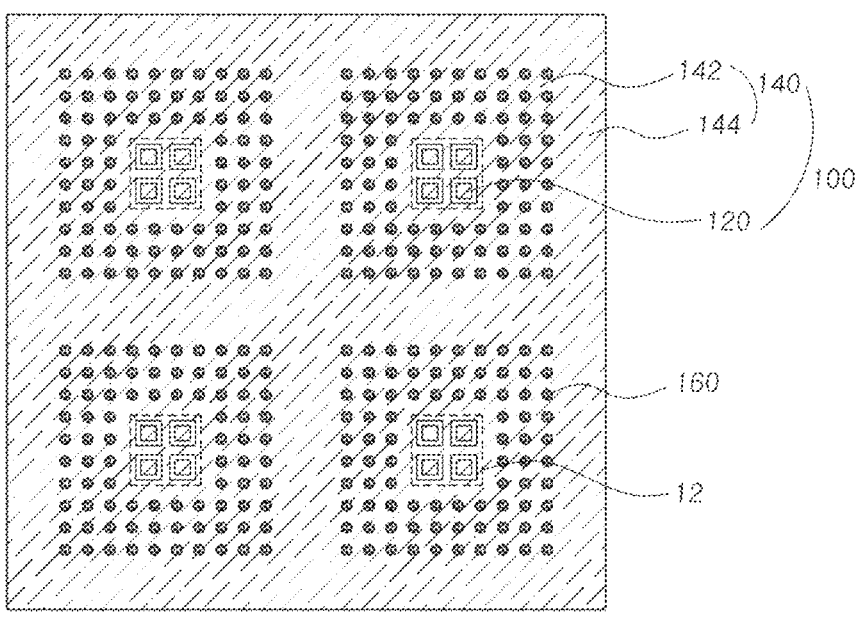
Figure 5:
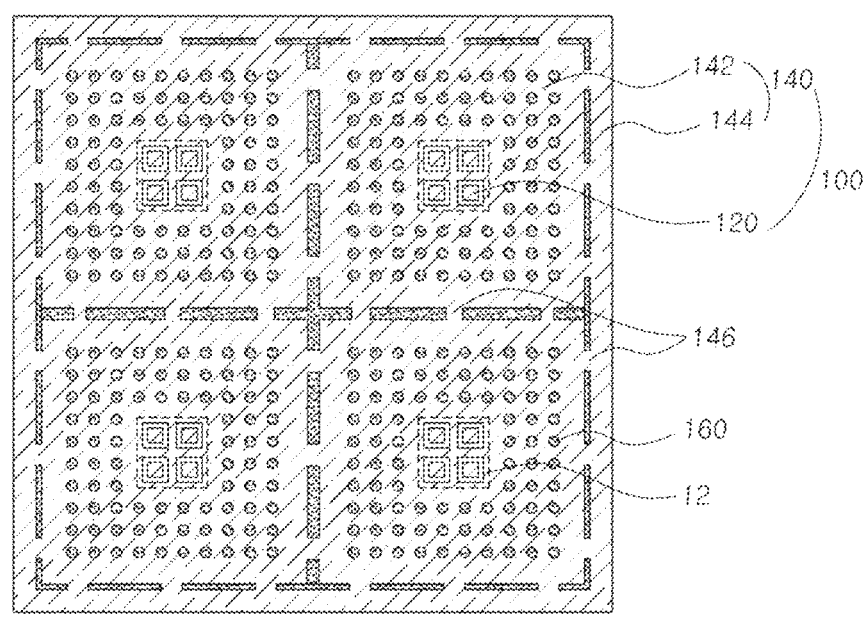
Figure 6:
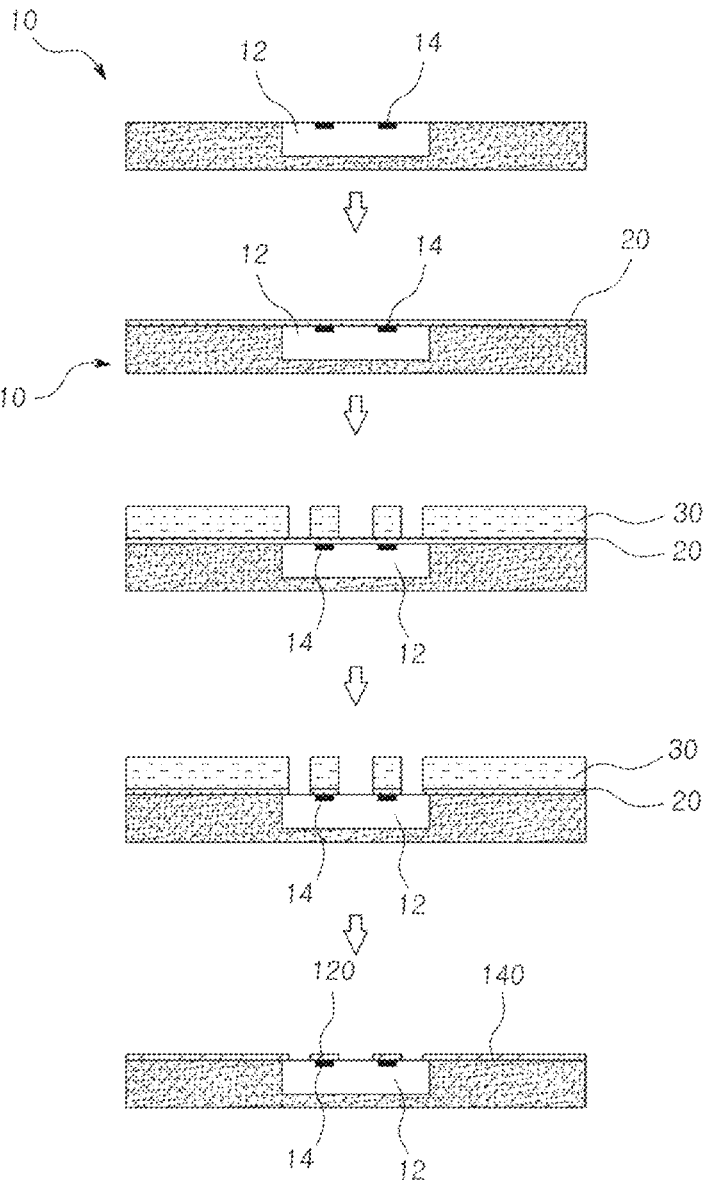
FIGS. 6 to 8 are schematic diagrams illustrating forming a base metal layer on a fan-out packaging substrate according to various embodiments of the present invention.
Figure 7:
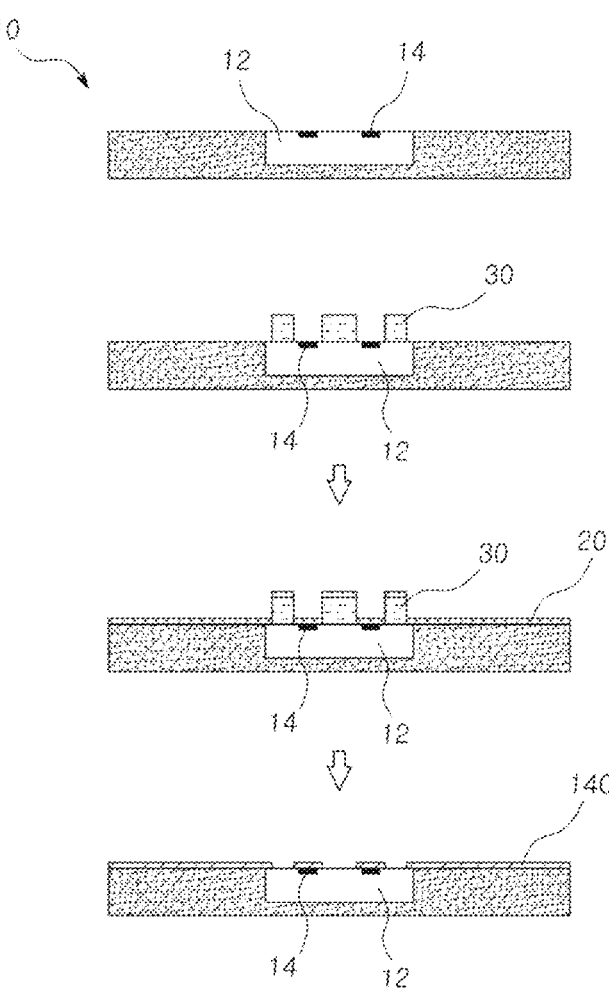
Figure 8:
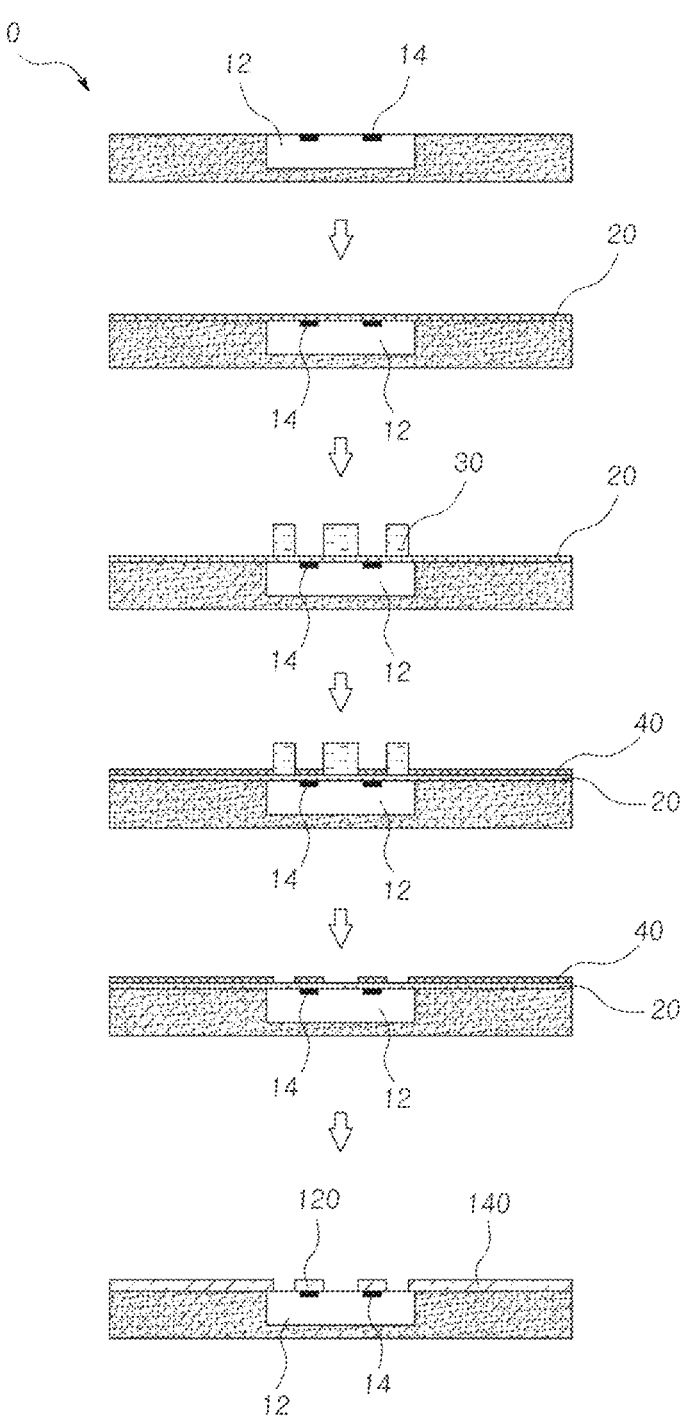

Hereinafter, embodiments of the present invention will be described in detail with reference to the annexed drawings. FIG. 1 is a side schematic diagram illustrating a method of manufacturing a fan-out packaging device according to an embodiment of the present invention, FIG. 2 is a schematic diagram illustrating a base metal layer formed on a fan-out packaging substrate according to various embodiments of the present invention, FIGS. 3 to 5 are plan schematic diagrams illustrating a fan-out packaging substrate on which a base metal layer is formed according to various embodiments of the present invention, and FIGS. 6 to 8 are schematic diagrams illustrating forming a base metal layer on a fan-out packaging substrate according to various embodiments of the present invention.

As shown in FIG. 1, the method of manufacturing a fan-out packaging device according to an embodiment of the present invention is a method of manufacturing a packaging device using a wafer or panel level packaging process, and includes forming a base metal layer 100 on a part of the fan-out packaging substrate 10, forming a first dielectric layer 200 on the base metal layer 100, patterning the first dielectric layer 200 to form a via hole 220, forming a re-distribution line (RDL) 300 on the first dielectric layer 200 and the via hole 220, forming a second dielectric layer 400 on the redistribution layer 300, and patterning the second dielectric layer 400 to form a bump structure 500 connected to the redistribution layer 300.

The fan-out packaging device according to an embodiment of the present invention manufactured by the method is a packaging device using a wafer or panel level packaging process, and includes a fan-out packaging substrate, a base metal layer 100 formed on a partial area of the fan-out packaging substrate 10, a first dielectric layer 200 formed on the base metal layer 100 and including a via hole 220 exposing a part of the base metal layer 100, a redistribution layer (RDL) 300 formed on the first dielectric layer 200 and the via hole 220, a second dielectric layer 400 formed on the redistribution layer 300 and patterned to expose a part of the redistribution layer 300, and a bump structure 500 formed on the second dielectric layer and connected to the redistribution layer 300.

The present invention is directed to a process of manufacturing a packaging device using a wafer or panel level packaging process. First, a base metal layer 100 is formed on a partial area of the fan-out packaging substrate 10 (see FIGS. 1A and 1B).

The fan-out packaging substrate 10 according to an embodiment of the present invention is a wafer or substrate on which a single chip or a plurality of chip arrays is formed. Alternatively, the fan-out packaging substrate 10 is performed by dicing the chip, reconstituting the chip on a wafer or panel, and embedding the chip using an EMC (epoxy molding compound) or the like. In the present invention, the chip and the die 12 have the same meaning and are thus used interchangeably.

By forming the embedded die 12 on the wafer or panel, an input/output (I/O) signal pad 14 of the die 12 is exposed, areas other than the signal pad 14 are passivated, and the area outside the die 12 is provided as a fan-out area.

Figure 1A:
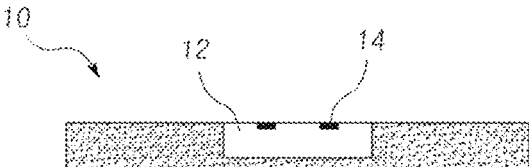
FIGS. 1A, 1B, 1C and 1D are side schematic diagrams illustrating a method of manufacturing a fan-out packaging device according to an embodiment of the present invention.
Figure 1B:
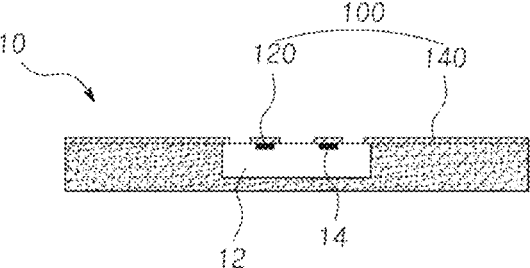

In one embodiment of the present invention, the base metal layer 100 is formed on a partial area of the fan-out packaging substrate 10 that is reconstructed on a wafer or panel and includes the embedded die 12 (see FIG. 1A).

Figure 2A:
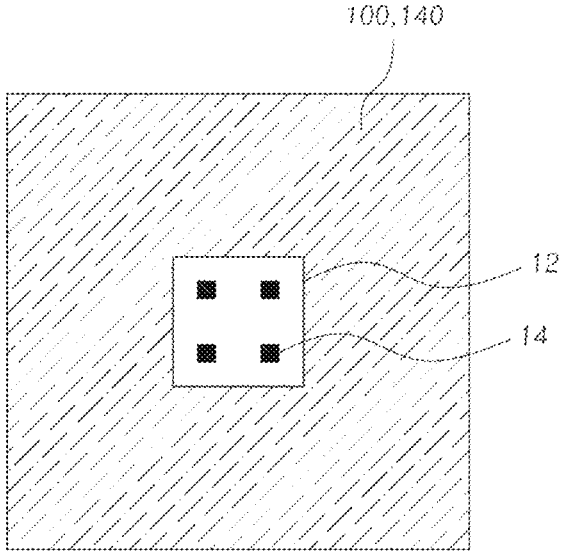
FIGS. 2A, 2B, and 2C are schematic diagrams illustrating a base metal layer formed on a fan-out packaging substrate according to various embodiments of the present invention.
Figure 2B:
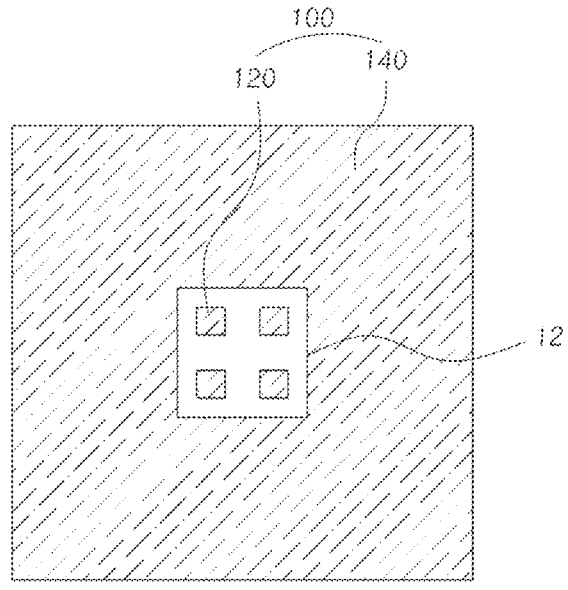
Figure 2C:
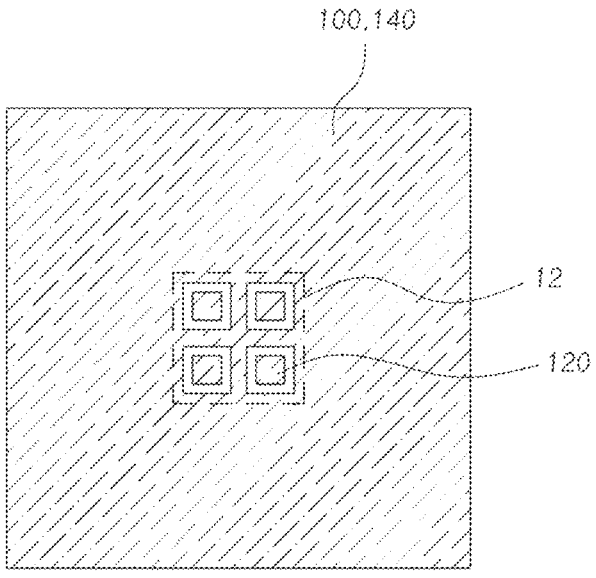

The base metal layer 100 may be formed in a partial area of the fan-out packaging substrate 10, for example, as shown in FIG. 2, in the remaining area of the fan-out packaging substrate 10 excluding the die 12 (FIG. 2A), or in the signal pad 14 of the die 12 and the remaining area of the fan-out packaging substrate 10 excluding the die 12 (FIG. 2B), or in the signal pad 14 of the die 12 and the remaining area of the fan-out packaging substrate 10 excluding the signal pad 14 and being separated therefrom (FIG. 2C). The area where the base metal layer 100 is formed is not limited to those described above and may be any one of various areas of the fan-out packaging substrate 10 depending on the use or purpose of the device.

In one embodiment of the present invention, the base metal layer 100 may be formed by a signal unit 120 formed on the signal pad 14 of the die 12 and by a base unit 140 that is separated from the signal unit 120 and formed on all or part of the remaining area of the fan-out packaging substrate 10.

That is, the base metal layer 100 may be formed in various areas of the fan-out packaging substrate 10. When the base metal layer 100 is formed on the signal pad 14 of the die 12, it is referred to as "signal unit 120" and when the base metal layer 100 is formed in other areas, it is referred to as "base unit 140".

As shown in FIG. 2A, the base metal layer 100 is formed by the base unit 140 formed in the remaining part of the fan-out packaging area excluding the die 12, as shown in FIG. 2B, the base metal layer 100 is formed by a signal unit 120 formed on the signal pad 14 of the die 12, and by the base unit 140 formed in the remaining part of the fan-out packaging area excluding the die 12, and as shown in FIG. 2C, the base metal layer 100 is formed by the signal pad 14 of the die 12 and the base unit 140 formed in the entire area separated from the signal pad 14.

In addition, in another embodiment of the present invention, the base metal layer 100 may be formed by a signal unit 120 formed in the signal pad 14 of the die 12, a first base unit 142 separated from the signal unit 120 and formed on a fan-out packaging device, and a second base unit 144 formed along the edge of the fan-out packaging device or the edge of the fan-out packaging substrate 10.

As described above, the base metal layer 100 formed on the signal pad 14 area of the die 12 corresponds to the signal unit 120, and the base metal layer 100 formed on other areas corresponds to the base unit 140. In this embodiment, when the die 12 is embedded on a wafer, the base metal layer 100 formed in the fan-out area (fan-out packaging device) and the die 12 area other than the signal pad 14 area is referred to as "the first base unit 142", and the base metal layer 100 formed along the edge of the other fan-out packaging substrate 10 (when the number of the die 12 is one, the fan-out packaging device and the fan-out packaging substrate have the same area. Refer to FIGS. 2 and 3) is referred to as the "second base unit 144".

This may be applied even when two or more dies 12 are embedded on a wafer or panel. The area of the die 12 other than the signal pad 14 area on the die 12 and the fan-out area, that is, the base metal layer 100 formed on each unit fan-out packaging device is defined as the first base unit 142, and the base metal layer 100 formed along the edges of the other fan-out packaging device and the fan-out packaging substrate 10 is defined as the second base unit 144.

This may be applied even when a large number of dies 12 is packaged depending on the size of the wafer or panel, and is shown in FIGS. 4 and 5.

The plan schematic diagram illustrating the configuration according to the embodiment of FIG. 4, in which four dies 12 are embedded in a wafer or panel and the base metal layer 100 is formed on top thereof shows that the signal pad 14 area (signal unit 120) of the die 12 and the metal layer 100 are formed in the entire area (base unit 140) separated therefrom.

The first base unit 142 may be formed in the area of the die 12 other than the signal pad 14 area on the die 12 and the fan-out area, that is, on each unit fan-out packaging device, and the second base unit 144 may be formed along the edge of each unit fan-out packaging device and the fan-out packaging substrate 10.

Here, the edge of each unit fan-out packaging device represents the edge itself or the spacing area between adjacent fan-out packaging devices. This area may be an area where each unit fan-out packaging device is diced, to facilitate dicing. The base metal layer 100 is formed over the entire area of the wafer or panel (including the edge or periphery), in order to maximize the function of the conductive layer in the plating process.

FIG. 5 shows that a bridge 146 is formed between the first base unit 142 and the second base unit 144 in the embodiment of FIG. 4, which facilitates the dicing process of the unit fan-out packaging device. In other words, the bridge 146 minimizes the effect of the base metal layer 100 on the separation of the unit fan-out packaging devices and easily separates each unit fan-out packaging device. For this purpose, the width of the bridge 146 is preferably formed to be 100 μm or less.

Meanwhile, the signal unit 120 according to an embodiment of the present invention is formed in a wider area than the signal pad 14 of the die 12. That is, the signal unit 120, which is the base metal layer 100 formed on the signal pad 14 area of the die 12, is formed over a wider area while completely covering the signal pad 14 of the die 12. This widens the contact area and thus allows for more tolerance for alignment errors in subsequent processes due to the higher degree of contact freedom than the diameter of the via hole 220, thereby improving design and process convenience. This improves contact resistance and achieves higher manufacturing yield.

That is, because the signal pad 14 of the conventional die 12 has a small area, an open or short circuit connection is easily created during the packaging process due to an alignment error with the redistribution layer 300, ultimately resulting in low manufacturing yield. However, the present invention minimizes the problem of alignment errors by forming the signal unit 120 that is wider than the signal pad 14 of the die 12.

In addition, by forming the signal unit 120 wider than the signal pad 14 area of the die 12, the use of the actual die 12 area can be maximized using the opened signal unit 120 without using the routing resources of the redistribution layer 300.

Forming the base metal layer 100 (forming the signal unit 120) on the signal pad 14 of the die 12 may be selectively used depending on the process conditions or the use and purpose of the device.

Meanwhile, a hole 160 or a roughness pattern may be formed in a partial or the entire area of the base metal layer 100. FIGS. 3 to 5 show that holes 160 are mainly formed in the fan-out area of the fan-out packaging device. The hole 160 aims at distributing mechanical or thermal stress throughout the base metal layer 100 (prevent warping of the wafer or panel).

In addition, in an embodiment of the present invention, the diameter of the hole 160 and the roughness pattern is preferably less than twice the thickness of the base metal layer 100 in order to provide the mechanical or thermal stress distribution effect, and maintain the surface topology of the dielectric layer formed thereon. When the diameter of the hole 160 and the roughness pattern is more than twice the thickness of the base metal layer 100, the surface topology of the dielectric layer formed on the top deteriorates, forming a non-uniform dielectric layer, and further causing deterioration in quality of the redistribution layer 300 and wiring layer defects.

In addition, the base metal layer 100 is formed of a metal with excellent electrical and thermal conductivity, and copper (Cu) is used in an embodiment of the present invention. In addition, in order to improve the coating and adhesion with the surface of the fan-out packaging substrate 10, the base metal layer 100 may be obtained as a composite metal layer by first forming a titanium (Ti) or titanium tungsten (TiW) layer, and then forming a copper layer thereon.

Overall, the thickness of the base metal layer 100 may be 2.2 µm or less, preferably 1 to 2 µm, in consideration of the thickness and function of the device. The thickness of the titanium (Ti) or titanium tungsten the (TiW) layer in the composite metal layer may be 0.05 to 0.1 µm.

As described above, the base metal layer 100 may be formed on a partial area of the fan-out packaging substrate 10, and FIGS. 6 to 8 illustrate a process of forming the base metal layer 100 on the fan-out packaging substrate 10. The base metal layer 100 of FIGS. 6 to 8 is formed on the signal pad 14 area of the die 12 and the remaining area of the fan-out packaging substrate 10 excluding the die 12 (see FIG. 2B).

FIG. 6 shows a process of forming the base metal layer 100 by patterning and etching processes. Specifically, the metal layer 20 (titanium (Ti) or titanium tungsten (TiW) layer has a thickness of 0.05 to 0.1 µm, and the copper layer has a thickness of 1 to 2 µm) is formed on the fan-out substrate, a photoresist pattern 30 is formed thereon by a photolithography process, the metal layer 20 is etched using the photoresist pattern 30 as an etching mask, and then the photoresist pattern 30 is removed. Here, the metal layer 20 is formed by a known physical or chemical thin film deposition method. In one embodiment of the present invention, the metal layer 20 is formed by a sputtering process.

FIG. 7 shows the formation of the base metal layer 100 through patterning and deposition processes. The photoresist pattern 30 is formed on the fan-out substrate through a photolithography process, the metal layer 20 is deposited using the photoresist pattern 30 as a deposition mask and then the photoresist pattern 30 is removed.

FIG. 8 shows that the plating layer 40 is first formed, and then the base metal layer 100 is formed by patterning, depositing the metal layer 20 and etching the plating layer 40. Specifically, a plating layer 40 is formed on the fan-out substrate, a photoresist pattern 30 is formed on the plating layer 40 through a photolithography process, a metal layer 20 is deposited using the photoresist pattern 30 as a deposition mask, the photoresist pattern 30 is removed and the plating layer 40 is etched.

As such, the base metal layer 100 according to the present invention is obtained by first forming a metal layer on the fan-out packaging substrate 10 and then forming the base metal layer 100 on a partial area of the fan-out packaging substrate 10 through patterning and etching processes, or is obtained by first forming the photoresist pattern 30, forming the metal layer 20 and forming the base metal layer 100 on a partial area of the fan-out packaging substrate 10 by removing the photoresist pattern 30, or is obtained by first forming the plating layer 40, further depositing the metal layer 20 through a patterning process, and then etching the plating layer 40 on a portion of the fan-out packaging substrate 10. In addition, the base metal layer 100 may be formed by a combination of various processes such as various physical and chemical vapor deposition, etching, and lift-off.

As such, by forming the base metal layer 100 in a partial area of the fan-out packaging substrate 10 according to an embodiment of the present invention, high quality of the dielectric layer and redistribution layer 300, which are formed through subsequent processes, is obtained. The base metal layer 100 improves the surface topology of the dielectric layer formed thereon and improves the quality of the redistribution layer 300 formed thereon.

In addition, the base unit 140 is separated from the signal pad 14 and covers the entire remaining area of the element, so that it is connected to the ground plate of the subsequent redistribution layer 300 or the bump structure (solder bump and UBM layer) 500 through the via hole 220, thereby improving the degree of freedom in contact and connection of the device and facilitating stable operation of the device.

In addition, the base metal layer 100 serves as a seed layer during electroplating to form the redistribution layer 300 and the bump structure 500 in the subsequent process, thereby providing very low impedance connection in the plating process, uniformity of plating thickness in the redistribution layer 300 and bump structure 500 without the necessity to significantly lower the plating speed, providing a maximized conductive layer through the seed layer with a large area, and thus improving the quality of the redistribution layer 300 and the bump structure 500. The base metal layer 100 may be more effectively applied when forming a plurality of redistribution layers 300.

In addition, when the base metal layer 100 according to the present invention is used as a ground plate, it provides a low impedance signal return path to the redistribution layer 300, thus enabling very high frequency operation.

In addition, the base metal layer 100 according to the present invention provides an electrical shielding function between the redistribution layer 300 and the die 12, thereby enabling stable electrical operation.

Figure 1C:
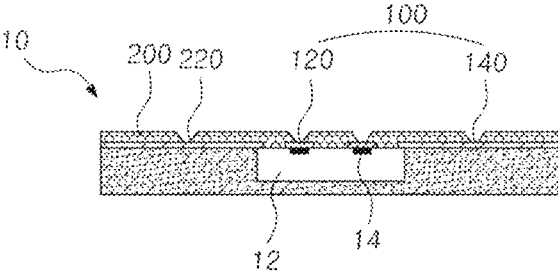

In addition, after forming the base metal layer 100 on the fan-out packaging substrate 10, the process of forming the dielectric layer and the redistribution layer 300 is performed (FIG. 1C).

First, a first dielectric layer 200 is formed on the base metal layer 100, the first dielectric layer 200 is patterned to form a via hole 220, and a redistribution layer 300 is formed on the first dielectric layer 200 and the via hole 220.

The first dielectric layer 200 is formed of an organic or inorganic dielectric material, and may be formed of a polymer material such as polyimide, polybenzoxazole (PBO), or benzocyclobutene (BCB), or may be formed of an inorganic material such as an oxide or nitride. Preferably, the first dielectric layer 200 may be formed of silicon nitride or silicon oxide. In addition, in various embodiments, the first dielectric layer 200 may be formed of an oxide such as $SiO_2$, $SiO_x$, $Al_2O_3$, $ZrO_2$, or $Ta_2O_5$, a nitride such as $SiN_x$, $Si_3N_4$, ZrN, AlN, BN, TaN, or TaN, or a combination thereof, if necessary. In addition, the material for the first dielectric layer 200 may be the same as or different from that of the second dielectric layer 400, which will be described later.

This dielectric layer may be formed by a process such as spin coating, CVD (chemical vapor deposition), sputtering, laminating or a combination thereof, and may be formed by appropriate physical and chemical vapor deposition processes.

Then, the first dielectric layer 200 is patterned to form a via hole 220. The via hole 220 is formed through patterning and etching processes, and the via hole 220 is filled with a metal and thus serves as an electrical connection path between the upper and lower components.

A plurality of via holes 220 including the via hole 220 is formed in the first dielectric layer 200 to expose parts of the base metal layer 100. In addition, the via holes 220 are also formed in the signal pad 14 area of the die 12. That is, the via holes 220 are formed at appropriate positions on the first dielectric layer 200 to expose the base metal layer 100 and the signal pad 14 area, and the via holes 220 may be formed in other necessary areas.

The via hole 220 may be filled with any one of various metal materials such as aluminum (Al), tungsten (W), titanium (Ti), and copper (Cu), and may be filled therewith through sputtering, ALD (atomic layer deposition), CVD, or electroplating.

In an embodiment of the present invention, electroplating with good step coverage and excellent cost and productivity is used, and copper is used as the metal material.

In addition, by forming the redistribution layer 300 on the first dielectric layer 200 and the via hole 220, the redistribution layer 300 is electrically connected to the base metal layer 100 or the signal pad 14 of the die 12. The redistribution layer 300 is obtained by forming a metal layer on the first dielectric layer 200 during or after formation of the via hole 220, forming a metal layer on the first dielectric layer 200 and forming a metallization pattern thereof.

That is, the redistribution layer 300 according to an embodiment of the present invention is formed by electroplating a copper layer and forming a signal line for rearrangement of electrical connection wiring of the signal pad 14 exposed from the die 12 through patterning and etching processes.

The redistribution layer 300 may be formed as a single, multi-, or double-sided redistribution layer 300. That is, a plurality of redistribution layers/dielectric layers are implemented by repeating the formation of the dielectric layer and the metal layer (repeating the first dielectric forming process and the redistribution layer 300 forming process) to form a redistribution signal line in the fan-out area.

As described above, by forming the base metal layer 100 in a partial area of the fan-out packaging substrate 10 according to an embodiment of the present invention, high quality of the dielectric layer and redistribution layer 300, which is formed through subsequent processes, is obtained. The base metal layer 100 improves the surface topology of the dielectric layer formed thereon and the quality of the redistribution layer 300 formed thereon.

In addition, the base unit 140 is separated from the signal pad 14 and covers the entire remaining area of the element, so that it is connected to the ground plate of the subsequent redistribution layer 300 or the bump structure (solder bump and UBM layer) 500 through the via hole 220, thereby improving the degree of freedom in contact and connection of the device and facilitating stable operation of the device.

In addition, the base metal layer 100 serves as a seed layer during electroplating to form the redistribution layer 300 and the bump structure 500 in the subsequent process, thereby providing an additional electricity passage, improving the plating speed due to a low impedance in the redistribution layer 300 and the bump structure 500, providing uniformity of the plating layer due to the large area of seed layer, and improving the quality of the redistribution layer 300 and the bump structure 500.

In addition, the base metal layer 100 according to the present invention functions to electrically shield the redistribution layer 300 from the die 12, thereby enabling stable electrical operation.

In addition, the base metal layer 100 according to the present invention is formed at the edge of each unit fan-out packaging device or at the spacing area between adjacent fan-out packaging devices in order to facilitate dicing. The base metal layer 100 is formed over the entire area (even to the edge or periphery) of the wafer or panel and thus maximizes the function thereof as a conductive layer during plating.

Figure 1D:
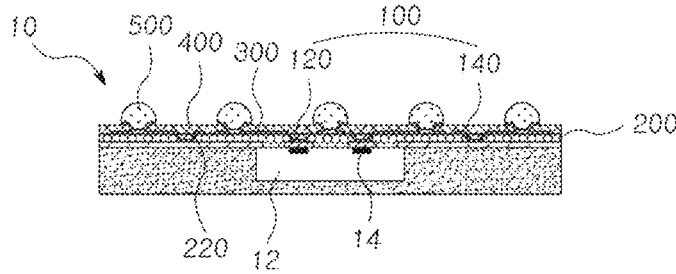

Then, a second dielectric layer 400 is formed on the redistribution layer 300, and the second dielectric layer 400 is patterned to form a bump structure 500 connected to the redistribution layer 300 (FIG. 1D).

The second dielectric layer 400 is formed using the same or similar materials and processes as the first dielectric layer 200 described above and is patterned to form a bump structure 500 connected to the redistribution layer 300.

Here, when a plurality of redistribution layers 300 is formed, the via hole 220 is formed in the same manner as in the first dielectric layer 200 by patterning the second dielectric layer 400, the redistribution layer 300 is formed through a plating process, and then the redistribution layers 300 are connected to each other and are connected to the base metal layer 100.

In FIG. 1D, the base metal layer 100 is formed on the fan-out packaging substrate 10, the first dielectric layer 200 is formed, the via hole 220 and the redistribution layer 300 are formed thereon, a second dielectric layer 400 is formed thereon, and a bump structure 500 is formed at a predetermined position through a patterning process.

The bump structure 500 according to an embodiment of the present invention is formed by forming UBM (under bump metallization) on the pattern (or via hole) of the second dielectric layer 400 (Ti/Cu layer deposition and patterning), solder plating, photoresist removal, unnecessary metal layer removal, and reflowing to form a solder bump, and these solder bumps and UBM are referred to as "bump structures 500" for convenience in the present invention.

As such, solder bumps may be formed at the wafer or panel level, additional or general packaging processes may be performed, and then separation into unit fan-out packaging devices may be possible through a dicing process.

By forming the base metal layer 100 in a partial area of the fan-out packaging substrate 10 according to an embodiment of the present invention, high quality of the dielectric layer and redistribution layer, which are formed through subsequent processes, is obtained. The base metal layer 100 improves the surface topology of the dielectric layer formed thereon and the quality of the redistribution layer formed thereon.

In addition, the base unit is separated from the signal pad and covers the entire remaining area of the element, so that it is connected to the ground plate of the subsequent redistribution layer or the bump structure (solder bump and UBM layer) through the via hole, thereby facilitating stable operation of the device.

In addition, the base metal layer serves as a seed layer during electroplating to form the redistribution layer 300 and the bump structure in the subsequent process, thereby providing very low impedance connection in the plating process, uniformity of plating thickness in the redistribution layer 300 and the bump structure 500 without the necessity to significantly lower the plating speed, providing a maximized conductive layer through the seed layer with a large area, and improving the quality of the redistribution layer 300 and the bump structure. The base metal layer 100 may be more effectively applied when forming a plurality of redistribution layers 300.

In addition, when the base metal layer according to the present invention is used as a ground plate, it provides a low impedance signal return path to the redistribution layer 300, thus enabling very high frequency operation.

In addition, the base metal layer according to the present invention provides an electrical shielding function between the redistribution layer and the die, thereby enabling stable electrical operation.

In addition, the base metal layer 100 according to the present invention is formed at the edge of each unit fan-out packaging device or at the spacing area between adjacent fan-out packaging devices in order to facilitate dicing. The base metal layer 100 is formed over the entire area (even to the edge or periphery) of the wafer or panel and thus maximizes the function thereof as a conductive layer during plating.

As apparent from the foregoing, by forming the base metal layer in a partial area of the fan-out packaging substrate according to an embodiment of the present invention, high quality of the dielectric layer and the redistribution layer, which are formed through subsequent processes, is obtained. The base metal layer improves the surface topology of the dielectric layer formed thereon and the quality of the redistribution layer formed thereon.

In addition, the base unit is separated from the signal pad and covers the entire remaining area of the element, so that it is connected to the ground plate of the subsequent redistribution layer or the bump structure (solder bump and UBM layer) through the via hole, thereby facilitating stable operation of the device.

In addition, the base metal layer serves as a seed layer during electroplating to form the redistribution layer and the bump structure in the subsequent process, thereby providing very low impedance connection in the plating process, uniformity of plating thickness in the redistribution layer and the bump structure without the necessity to significantly lower the plating speed, providing a maximized conductive layer through the seed layer with a large area and improving the quality of the redistribution layer and the bump structure. The base metal layer may be more effectively applied when forming a plurality of redistribution layers.

In addition, when the base metal layer according to the present invention is used as a ground plate, it provides a low impedance signal return path to the redistribution layer, thus enabling very high frequency operation.

In addition, the base metal layer according to the present invention provides an electrical shielding function between the redistribution layer and the die, thereby enabling stable electrical operation.

In addition, the base metal layer according to the present invention is formed at the edge of each unit fan-out packaging device or at the spacing area between adjacent fan-out packaging devices in order to facilitate dicing. The base metal layer is formed over the entire area (even to the edge or periphery) of the wafer or panel and thus maximizes the function thereof as a conductive layer during plating.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a fan-out packaging device using wafer or panel level packaging comprising:
   forming a base metal layer on a partial area of a fan-out packaging substrate;
   forming a first dielectric layer on the base metal layer;
   patterning the first dielectric layer to form a via hole;

12 forming a redistribution layer (RDL) on the first dielectric layer and the via hole;
   forming a second dielectric layer on the redistribution layer (RDL); and patterning the second dielectric layer to form a bump structure connected to the redistribution layer;
   wherein the base metal layer comprises:
   a signal unit formed on a signal pad area of a die; and
   a base unit separated from the signal unit and formed on an entirety or part of a remaining area of the fan-out packaging substrate;
   wherein the base unit comprises:
   a first base portion separated from the signal unit and formed on the fan-out packaging device; and
   a second base portion formed along an edge of the fan-out packaging device or an edge of the fan-out packaging substrate.

2. The method according to claim 1 wherein a bridge is formed between the first base portion and the second base portion.

3. The method according to claim 1 wherein the signal unit is formed in a wider area than the signal pad of the die.

4. The method according to claim 1 wherein the signal unit is aligned with and contacts the redistribution layer.

5. The method according to claim 1 wherein a ground plate of the redistribution layer and the bump structure is connected to the base unit through a via hole of the first dielectric layer.

6. The method according to claim 1, wherein a hole or a roughness pattern is formed in an entirety or part of the base metal layer.

7. The method according to claim 6, wherein diameters of the hole and the roughness pattern are less than twice a thickness of the base metal layer.

8. The method according to claim 1, wherein the base metal layer comprises a copper (Cu)-based material.

9. The method according to claim 8, wherein the base metal layer is formed as a copper layer on a titanium (Ti) or titanium tungsten (TiW) layer.

10. The method according to claim 1, wherein the base metal layer has a thickness of 1 to 2.2 μm.

11. The method according to claim 1, wherein the base metal layer is formed by forming a metal layer on the fan-out packaging substrate, forming a photoresist pattern on the fan-out packaging substrate through a photolithography process, etching the metal layer using the photoresist pattern as an etching mask, and then removing the photoresist pattern.

12. The method according to claim 1, wherein the base metal layer is formed by forming a photoresist pattern on the fan-out packaging substrate through a photolithography process, depositing a metal layer using the photoresist pattern as a deposition mask, and removing the photoresist pattern.

13. The method according to claim 1, wherein the base metal layer is formed by forming a plating layer on the fan-out packaging substrate, forming a photoresist pattern on the plating layer through a photolithography process, depositing a metal layer using the photoresist pattern as a deposition mask, removing the photoresist pattern, and etching the plating layer.

14. The method according to claim 1, wherein the formation of the first dielectric layer and the formation of the redistribution layer are repeatedly performed to form a plurality of redistribution layers/dielectric layers.

15. A fan-out packaging device for wafer or panel level packaging comprising:
   a fan-out packaging substrate;

a base metal layer formed on a partial area of the fan-out packaging substrate;

a first dielectric layer formed on the base metal layer and including a via hole to expose a part of the base metal layer;

a redistribution layer (RDL) formed on the first dielectric layer and the via hole;

a second dielectric layer formed on the redistribution layer (RDL) and patterned to expose a part of the redistribution layer; and a bump structure formed on the second dielectric layer and connected to the redistribution layer;

wherein the base metal layer comprises:

a signal unit formed on a signal pad area of a die; and a base unit separated from the signal unit and formed on an entirety or part of a remaining area of the fan-out packaging substrate;

wherein the base unit comprises:

a first base portion separated from the signal unit and formed on the fan-out packaging device; and a second base portion formed along an edge of the fan-out packaging device or an edge of the fan-out packaging substrate.

16. The fan-out packaging device according to claim 15 wherein a bridge is formed between the first base portion and the second base portion.

17. The fan-out packaging device according to claim 15 wherein the signal unit is formed in a wider area than the signal pad of the die.

18. The fan-out packaging device according to claim 15 wherein the signal unit is aligned with and contacts the redistribution layer.

19. The fan-out packaging device according to claim 15 wherein a ground plate of the redistribution layer and the bump structure is connected to the base unit through the via hole of the first dielectric layer.

20. The fan-out packaging device according to claim 15, wherein a vertical through-hole or a roughness pattern is formed in an entirety or part of the base metal layer.

21. The fan-out packaging device according to claim 20, wherein diameters of the hole and the roughness pattern are less than twice a thickness of base metal layer.

22. The fan-out packaging device according to claim 15, wherein the base metal layer comprises a copper (Cu)-based material.

23. The fan-out packaging device according to claim 22, wherein the base metal layer is formed as a copper layer on a titanium (Ti) or titanium tungsten (TiW) layer.

24. The fan-out packaging device according to claim 15, wherein the base metal layer has a thickness of 1 to 2.2 μm.

* * * * *